United States Patent
Stern (10) Patent No.: US 11,489,313 B2
(45) Date of Patent: Nov. 1, 2022

(54) FAST TUNABLE INTEGRATED LASER

(71) Applicant: Nokia Technologies Oy, Espoo (FI)

(72) Inventor: Brian Stern, Ocean, NJ (US)

(73) Assignee: NOKIA TECHNOLOGIES OY, Espoo (FI)

( * ) Notice: Subject to any disclaimer, the term of this patent is extended or adjusted under 35 U.S.C. 154(b) by 257 days.

(21) Appl. No.: 16/731,742

(22) Filed: Dec. 31, 2019

(65) Prior Publication Data

US 2021/0203132 A1 Jul. 1, 2021

(51) Int. Cl.
| | |
|---|---|
| *H01S 5/062* | (2006.01) |
| *H01S 5/10* | (2021.01) |
| *H01S 5/0687* | (2006.01) |
| *H01S 5/0625* | (2006.01) |

(52) U.S. Cl.
CPC .......... *H01S 5/0622* (2013.01); *H01S 5/0687* (2013.01); *H01S 5/1071* (2013.01); *H01S 5/06256* (2013.01)

(58) Field of Classification Search
CPC ...... G01S 7/484; H01S 5/1071; H01S 5/0035; H01S 5/0428; H01S 5/0622; H01S 5/06223; H01S 5/06246; H01S 5/062; H01S 5/10
USPC ................................ 372/25, 29.01; 359/340
See application file for complete search history.

(56) References Cited

U.S. PATENT DOCUMENTS

| | | | |
|---|---|---|---|
| 8,665,450 B2* | 3/2014 | Johnson | G01B 9/02007 356/497 |
| 9,595,804 B2 | 3/2017 | Minneman et al. | |
| 9,653,882 B1 | 5/2017 | Zheng et al. | |
| 9,780,528 B1 | 10/2017 | Zheng et al. | |
| 2002/0085609 A1 | 7/2002 | Ksendzov et al. | |
| 2006/0188200 A1 | 8/2006 | Taghavi-Larigani et al. | |
| 2014/0307753 A1* | 10/2014 | Minneman | H01S 5/062 372/20 |
| 2017/0324218 A1 | 11/2017 | Krishnamoorthy et al. | |

OTHER PUBLICATIONS

Bonesi et al., "Akinetic All-Semiconductor Programmable Swept-Source at 1550 nm and 1310 nm with Centimeters Coherence Length", Optics Express, Jan. 2014, vol. 22, No. 3, pp. 2632-2655.
Chen et al., "Hybrid Silicon Tunable Filter Based on a Mach-Zehnder Interferometer and Ring Resonantor", 2009 International Topical Meeting on Microwave Photonics, Oct. 2009, 4 pgs.
Dong et al., "Submilliwatt, Ultrafast and Broadband Electro-Optic Silicon Switches," Optics Express, Nov. 2010, vol. 18, No. 24, pp. 25225-25231.
Latkowski et al., "Monolithically Integrated Widely Tunable Laser Source Operating at 2μm", Optica, Dec. 2016, vol. 3, No. 12, pp. 1412-1417.

(Continued)

*Primary Examiner* — Tuan N Nguyen
(74) *Attorney, Agent, or Firm* — Chiesa Shahinian & Giantomasi PC (57) ABSTRACT

An apparatus includes a wavelength-tunable laser and an electronic controller. The electronic controller is configured to control the wavelength-tunable laser such that an output wavelength of the wavelength-tunable laser performs a zigzag in time. The wavelength-tunable laser is capable of rapidly and densely scanning wavelengths across a broad spectral range.

24 Claims, 7 Drawing Sheets

(56) References Cited

OTHER PUBLICATIONS

Tang et al., "Narrow-Spectral-Linewidth Silicon Photonic Wavelength-Tunable Laser with Highly Asymmetric Mach-Zehnder Interferometer", Optics Letters, Apr. 2015, vol. 40, No. 7, pp. 1504-1507.
Verdier et al., "Ultrawideband Wavelength-Tunable Hybrid External-Cavity Lasers", Journal of Lightwave Technology, Jan. 2018, vol. 36, No. 1, pp. 37-43.
Pajković et al., "Tuning of a Widely Tunable Monolithically Integrated InP Laser for Optical Coherence Tomography", retrieved online Dec. 18, 2019, at https://www.spiedigitallibrary.org/confernece-proceedings-of-spie, 9 pgs.

\* cited by examiner

FAST TUNABLE INTEGRATED LASER

TECHNICAL FIELD

The present disclosure relates generally to tunable lasers.

BACKGROUND

A tunable laser sweeps the output wavelength (or frequency) of the laser across a spectral range. Given their versatility, tunable lasers can be used in many different systems and applications. However, many commercial tunable lasers are large and rely on non-integrated parts, making them more expensive and not very portable. Additionally, such tunable lasers often include moving parts, which cause the tunable lasers to be sensitive to vibrations, experience hysteresis, suffer from nonlinear sweeps, and be susceptible to drifting or degradation over time.

Even integrated tunable lasers without moving parts may suffer from disadvantages related to their tuning mechanisms, which inhibit performance in certain applications requiring speed and precision. For example, thermo-optic tuning mechanisms for tuning the phase of waveguides in integrated tunable lasers are slow (e.g., typically microsecond time scale).

Solutions that utilize lasers based on other materials, such as III-V materials, are typically more expensive to fabricate due to factors such as cost of the wafers, low yield, and difficulties with processing such materials. These lasers also tend to have poor linewidths (e.g., broad MHz-scale linewidths) due to the losses in III-V materials and, consequently, the coherence length of such devices is short due to the broad linewidths.

SUMMARY

Some embodiments may include an optical filter tunable via carrier depletion tuning, e.g., in silicon. Such an optical filter may be capable of much faster tuning (e.g., sub-nanosecond time scale) than a thermally tunable optical filter. But, a fast tunable optical filter may have a long cavity length (leading to a small free spectral range), which is not desirable for scanning wavelengths over a broad range. These issues are addressed, in accordance with some embodiments of a wavelength-tunable laser that can rapidly and densely scan wavelengths across a broad spectral range.

In a first embodiment, an apparatus includes a wavelength-tunable laser and an electronic controller that is configured to control the wavelength-tunable laser such that an output wavelength of the wavelength-tunable laser performs a zigzag in time. In some examples of the first embodiments, the wavelength-tunable laser may include a first and a second tunable filter apparatus and the electronic controller may be configured to wavelength-tune the second tunable filter apparatus at a rate, at least, 5 times slower than the electronic controller is configured to wavelength-tune the first tunable filter apparatus. In some examples of the first embodiments, the zigzag in time may include a sequence of monotonic wavelength sweeps in time, each of the monotonic wavelength sweeps including a respective sequence of values of the output wavelength of the wavelength-tunable laser, the values of different ones of the monotonic wavelength sweeps being interleaved. In some examples of the first embodiments, the electronic controller may be further configured to generate a single monotonic wavelength sweep of the output wavelengths from the values of the monotonic wavelength sweeps. In some examples of the first embodiments, the zigzag in time may include a sequence of wavelength sweeps in time in which wavelengths are scanned out of order in each of the wavelength sweeps, each of the wavelength sweeps including a respective set of values of the output wavelength of the wavelength-tunable laser, the values of different ones of the wavelength sweeps being interleaved.

In any examples of the first embodiments, the wavelength-tunable laser may be an integrated device including an optical amplifier and a waveguide laser cavity including the optical amplifier, and the waveguide laser cavity may include a first tunable filter apparatus and a second tunable filter apparatus in a sequential arrangement. In some examples of the first embodiments, the optical amplifier may be a reflective semiconductor optical amplifier and the waveguide laser cavity may be a silicon waveguide laser cavity. In some examples of the first embodiments, the first tunable filter apparatus may include one or more tunable Mach-Zehnder interferometers and the second tunable filter apparatus may include one or more tunable optical ring resonators. In some examples of the first embodiments, the tunable Mach-Zehnder interferometers may be semiconductor junction devices. In any examples of the first embodiments, the tunable Mach-Zehnder interferometers and the tunable optical ring resonators may be configured to perform, in combination, filtering to select a lasing mode for the wavelength-tunable laser.

In some examples of the first embodiments, the apparatus may further include a directional light detection and ranging (LIDAR) device having an optical transmitter and an optical receiver, with the optical transmitter including the wavelength-tunable laser and the electronic controller. In other examples of the first embodiments, the apparatus may further include an optical coherence tomography imaging apparatus that includes the wavelength-tunable laser and the electronic controller.

In a second embodiment, a directional light detection and ranging (LIDAR) apparatus includes a wavelength-tunable laser and an electronic controller that is configured to control the wavelength-tunable laser such that an output wavelength of the wavelength-tunable laser performs a zigzag in time. In some examples of the second embodiments, the wavelength-tunable laser may include a first and a second tunable filter apparatus and the electronic controller may be configured to wavelength-tune the first and second tunable filter apparatuses, such that the second tunable filter apparatus wavelength-tunes at a rate, at least, 5 times slower than the first tunable filter apparatus wavelength-tunes. In some examples of the second embodiments, the zigzag in time may include a sequence of monotonic wavelength sweeps in time, each of the monotonic wavelength sweeps including a respective sequence of values of the output wavelength of the wavelength-tunable laser, the values of different ones of the monotonic wavelength sweeps being interleaved. In some examples of the second embodiments, the electronic controller may be further configured to generate a single monotonic wavelength sweep of the output wavelengths from the values of the plurality of monotonic wavelength sweeps.

In any examples of the second embodiments, the wavelength-tunable laser may be an integrated device including an optical amplifier and a waveguide laser cavity including the optical amplifier, and the waveguide laser cavity may include a first tunable filter apparatus and a second tunable filter apparatus in a sequential arrangement. In some examples of the second embodiments, the first tunable filter apparatus may include one or more tunable Mach-Zehnder interferometers and the second tunable filter apparatus may include one or more tunable optical ring resonators. In some examples of the second embodiments, the tunable Mach-Zehnder interferometers may be semiconductor junction devices. In any examples of the second embodiments, the tunable Mach-Zehnder interferometers and the tunable optical ring resonators may be configured to perform, in combination, filtering to select a lasing mode for the wavelength-tunable laser.

DETAILED DESCRIPTION

Various embodiments will now be described more fully with reference to the accompanying drawings in which some of the embodiments are shown. It should be understood, however, that there is no intent to limit embodiments to the particular forms disclosed, but on the contrary, the embodiments described herein are intended to cover all modifications, equivalents, and alternatives falling within the scope of the claims. Where appropriate, like numbers refer to like elements throughout the description of the figures. It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the disclosed embodiments. As used herein, the term "and/or" includes any and all combinations of one or more of the associated listed items.

To address the disadvantages of current solutions, a wavelength-tunable laser, e.g., an integrated laser, is described according to various embodiments that can cover a broad (wide) spectral range (e.g., in one example, greater than approximately 50-100 nm in the 1.5 micron wavelength range) and with fast speeds (e.g., approximately 1-10 ns for some wavelength changes). In some applications, it is desirable to not only have a fast and widely tunable laser, but also one based in a CMOS-compatible material such as silicon. In particular, a tunable laser that is very compact, robust, and inexpensive may be produced using silicon photonics. Silicon processing leverages mature wafer-scale manufacturing to fabricate integrated photonic devices. Due to the low cost of silicon, and the high processing yield, silicon-based devices may be produced cost-effectively and in large quantities. Silicon waveguides also have low loss to support narrow laser linewidths (e.g., approximately less than 100 kHz, compared to MHz-scale linewidths in other materials).

Silicon photonic tunable lasers exist, but tuning speed is generally slow (e.g., microsecond scale) using thermo-optic effects. In many swept laser applications, it may be desirable for a full scan to be completed in 1 microsecond, for example, which equates to approximately 1 ns per wavelength point (for 1000 points). Although faster time scales may be achieved using electro-optic effects (e.g., carrier depletion or injection) instead of thermo-optic effects, challenges arise because doping waveguides for carrier depletion-based optical phase shifting introduces large optical losses, which makes lasing impractical or with low output power. Carrier injection designs also are subjected to heating effects, which can overtake the fast optical phase change from the carriers, as well as free-carrier absorption, which leads to propagation losses.

Such heat-induced issues may be mitigated to an extent by using long length waveguides to maintain lower carrier concentration and hence lower current, which reduces heat. Using such an optical phase shifter in a laser would allow for fast tuning (e.g., nanosecond time scale) and without much propagation loss. However, widely tunable lasers based in silicon may rely on wavelength-selective filters with short length waveguides, i.e., to provide large free spectral ranges (FSRs). For example, small optical ring resonator filters are commonly used in lasers to provide larger FSR filters, but if tuned using carrier injection, such filters could not typically be tuned significantly without inducing the negative effects of carrier injection. Therefore, small optical ring resonator filters are typically tuned thermally to provide a wide wavelength tuning range (via a large FSR). However, as noted previously, such thermal-based tuning is also slow.

Some embodiments described herein address the aforementioned issues by providing a fast and widely tunable laser based in a CMOS-compatible material such as silicon. More specifically, a wavelength-tunable laser apparatus according to embodiments described herein includes a combination of one or more wavelength-selective slow tunable optical filters with large FSR and one or more fast tunable optical filters in a silicon-based implementation. In one example, the wavelength-selective slow tunable optical filter may be a heater-tuned optical ring resonator that is serially coupled with a carrier-injection-tuned interferometer (e.g., utilizing long-length waveguides in one embodiment). In operation, the interferometer is the fast tuning element that may quickly tune (or switch) between various lasing modes that match with individual resonances of the ring resonator, these resonances being separated by the free spectral range (FSR) of the optical ring resonator, in between the slow tuning of the optical ring resonator itself. That is to say, the fast tuning element rapidly tunes (or switches) between lasing modes (each aligning with a ring resonance), with each set of fast tunings happening in between steps of slow tuning of the optical ring resonator or alternatively, happening during a tuning shift of one FSR of the optical ring resonator. The wavelength range is therefore scanned out-of-order and may be interleaved at the end of, or during, the set of wavelength scans. In this manner, the tunable laser (e.g., which can be a chip implementation) may be tuned quickly, covering a large wavelength range. Being based in silicon optical device, the linewidth should also be narrow (~100 kHz in an example).

Figure 1:
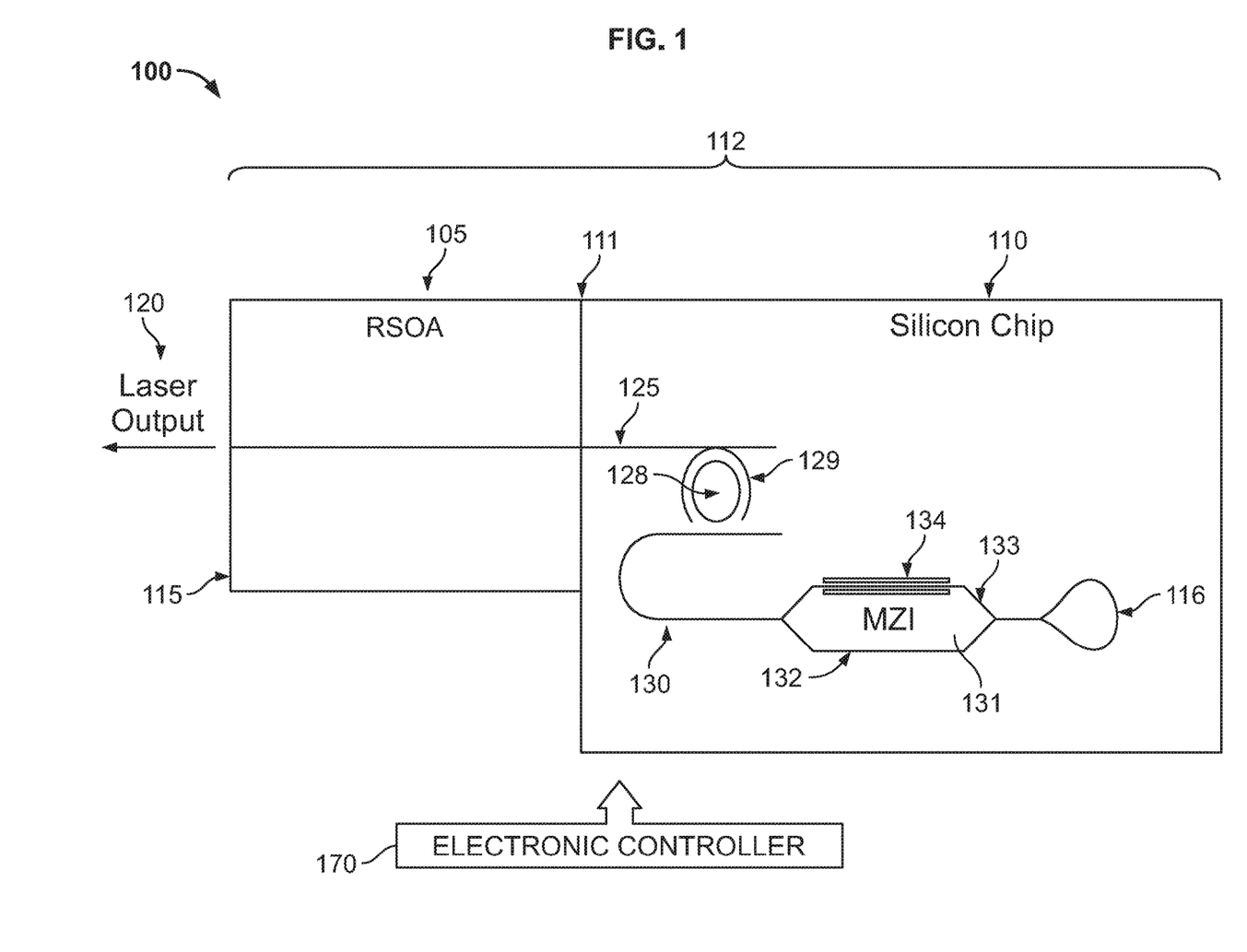
FIG. 1 shows a block diagram of a tunable laser according to one or more embodiments.

FIG. 1 shows a simplified block diagram of a wavelength-tunable laser 100 (referred to as tunable laser 100 hereinafter) according to an embodiment, e.g., an embodiment that is monolithically integrated onto a substrate (not shown). As shown, tunable laser 100 includes a reflective semiconductor optical amplifier (RSOA) 105 as the optical gain element, which is optically coupled via coupling region (e.g., interface) 111 to silicon chip 110, which includes a silicon waveguide segment of a laser cavity. RSOA 105 may be a III-V device that uses electrical pumping to amplify an optical signal. Coupling via interface 111 may be implemented in various ways including, but not limited to butt coupling, bonding (which may effectively eliminate coupling interface 111), and via flip-chip attachment, to name a few arrangements. An electronic controller 170, which may be communicatively coupled to tunable laser 100, is configured to control the functions and operations of tunable laser 100, as described in further detail below.

Together RSOA 105 and silicon chip 110 form lasing cavity (laser cavity) 112, which is formed between mirrors/reflectors 115 and 116. More specifically, reflector 115 is located at the facet of RSOA 105 and, in one embodiment, may reflect approximately 10% to 95% of the light and transmit the remainder as output 120 of the tunable laser (e.g., to free-space or to an optical fiber coupled thereto). Reflector 116 may be a loop mirror, as shown, or various other on-chip reflector elements, e.g., a distributed Bragg reflector (DBR) in one example. Accordingly, laser cavity 112 thus exists between two reflectors, reflector 116 on the silicon chip and reflecting nominally about 100% of the incident light, while reflector 115 is positioned at the facet of RSOA 105 and reflecting approximately 10% to 95% of the incident light and transmitting the remainder as output 120 of tunable laser 100. In other embodiments RSOA 105 may be configured to reflect approximately 100%, while silicon chip 110 may be terminated in a partial reflector. In that case, the output would be on the silicon chip (110) side instead of the RSOA (105) side.

As shown, silicon chip 110 includes waveguide 125 optically coupled to optical ring resonator 128 (also referred to as ring filter 128), which is tuned via electrical heater 129 positioned above ring filter 128 for use in slow tuning over a wide wavelength tuning range. Ring filter 128 is further optically coupled via waveguide 130 to tuning filter 131, which is Mach-Zehnder interferometer 131 (also referred to as MZI filter 131) in this embodiment. MZI filter 131, which serves as the fast tuning filter, includes waveguides 132 and 133. Waveguide 132 serves as the reference arm in MZI filter 131, while p-i-n diode 134 is used to induce phase shift in the optical signal traversing waveguide 133. More specifically, index tuning of the p-i-n diode 134 induces phase shifting of light propagating therealong, which enables the fast tuning capability of tunable laser 100, as will be described in further detail below. It should also be noted that the above configuration is meant to be illustrative only and not limiting in any manner. As one of several examples, an additional optical phase shifter (not shown), such as a second p-i-n diode that could be located between ring filter 128 and MZI filter 131 may be used in lasing cavity 112 for shifting the overall cavity phase of tunable laser 100. Also in some examples, an additional semiconductor junction type of optical phase shifter, e.g., a p-i-n diode, could be located in the second waveguide 132 of the MZI filter 131 to enable push-pull operation thereof.

Lasing cavity 112 has wavelength tunable filters (e.g., bandpass filters) to enable selection of a single mode (wavelength/frequency) to lase. In various embodiments, such wavelength filters in tunable laser 100 include a combination of one or more slow tuning filter elements and one or more fast tuning filter elements in a sequential arrangement. The example shown in FIG. 1 includes one slow tuning filter element (ring filter 128) and one fast tuning filter element (MZI filter 131). More specifically, ring filter 128, which is controlled by heater 129, has a slower tuning speed, but very sharp (e.g., narrow) filtering. For example, ring filter 128 can tune one full ring free spectral range (FSR), which is less than the FSR of a MZI, e.g., MZI filter 131.

The operation of ring filter 128 will now be described. Ring filter 128, which may be a micro-ring resonator in one example, can be advantageously used for its wavelength selectivity (e.g., a narrow passband). The passband is determined, in part, by the coupling between ring filter 128 and adjacent waveguides 125 and 130, which serve as add/drop waveguides, each of which can nominally have the same power coupling in one embodiment. Moreover, if the power coupling between ring filter 128 and each waveguide 125 and 130 is low, and if the propagation losses within ring filter 128 are low, then ring filter 128 will exhibit high quality factor (Q) with a narrow passband. Accordingly, ring filter 128 can be configured to aid in selection of a single mode to lase. In operation, heater 129 uses the thermo-optic effect to change the refractive index of silicon. For example, as current passes through (resistive) heater 129, heat is generated and conducts to the silicon waveguide of ring filter 128, thereby increasing the refractive index. This effect induces a phase shift, thereby shifting the spectrum of resonances of ring filter 128. Such effect can be strong, resulting in a shift in resonance by a full free spectral range (FSR) (e.g., see FSR 325 in FIG. 3A), meaning that a full range of wavelengths may be reached for lasing. However, while each resonance may successfully select a wavelength locally, the lasing modes at several resonances (e.g., see resonances 320 in FIG. 3A) of ring filter 128 may compete with each other.

Consequently, further filtering in combination with ring filter 128 can be used to further facilitate the selection of a lasing mode across a wide spectrum (e.g., RSOA 105 may provide substantial optical gain across approximately greater than 60 nm near the 1550 nm wavelength). Although two ring filters may also be used to create a Vernier effect to select lasing modes, tuning speed will be slow due to the thermo-optic control used for both ring filters, which may not be suitable for many applications that require faster tuning speeds.

In the embodiment shown in FIG. 1, MZI filter 131 may serve as the fast tuning filter element of the laser 100 to provide additional spectral filtering. A Mach-Zehnder interferometer, such as MZI filter 131, has a sinusoidal transmission spectrum. The optical phase shifter in MZI 131 (e.g., for waveguide 133) may be controlled by carrier injection, for example, which is capable of being rapidly changed to provide fast-effect adjustment of passband filtering wavelengths (tuning), e.g., in the order of nanosecond time scale in some examples. More specifically, as shown in FIG. 1, a p-doped/intrinsic/n-doped (p-i-n) diode 134 may be formed across and along a segment of a silicon waveguide 133. Applying forward bias to p-i-n diode 134 injects electrical carriers into silicon waveguide 133, thus resulting in a small change in refractive index, which leads to a different optical phase change of light propagating therealong. This different optical phase change shifts the output of MZI 131 as a result of constructive or destructive interference between light from the two waveguides (arms) 132 and 133. Using the path length difference of the two waveguides (arms) 132 and 133, the FSR of MZI 131 may be selected.

In some cases, the p-i-n diode carrier-injection scheme may require a large injected current in order to obtain an appreciable phase shift, which can lead to heat dissipation, which can, in turn, cause an unwanted thermo-optic shift of the optical index that obscures the phase change from the carriers. High carrier concentration can also induce unwanted propagation loss. However, such unwanted effects can be avoided by configuring p-i-n diode 134 to cover a long length of waveguide 133. In some non-limiting examples, such length may be approximately greater than 1 mm, approximately greater than 500 um, and so on depending on various considerations. The resulting lower carrier concentration over a longer length of waveguide 133 can achieve a large cumulative optical phase shift for light propagating therealong in a manner that is less susceptible to significant heating.

Accordingly, some of the embodiments described herein may achieve benefits and advantages by using a combination of a fast tuning filter element (e.g., MZI 131) with a slow tuning, narrow bandwidth filter element (e.g., ring filter 128). In particular, MZI 131 driven by p-i-n diode 134 provides a combination of high speed with moderately low propagation losses and shorter length to obtain a tunable optical phase shift (e.g., as compared to a p-n waveguide). When combined with ring filter 128, which has a narrower passband, MZI filter 131 can therefore be used to further filter a single resonance of separate ring filter 128, thus obtaining a single lasing mode for tunable laser 100.

Figure 2:
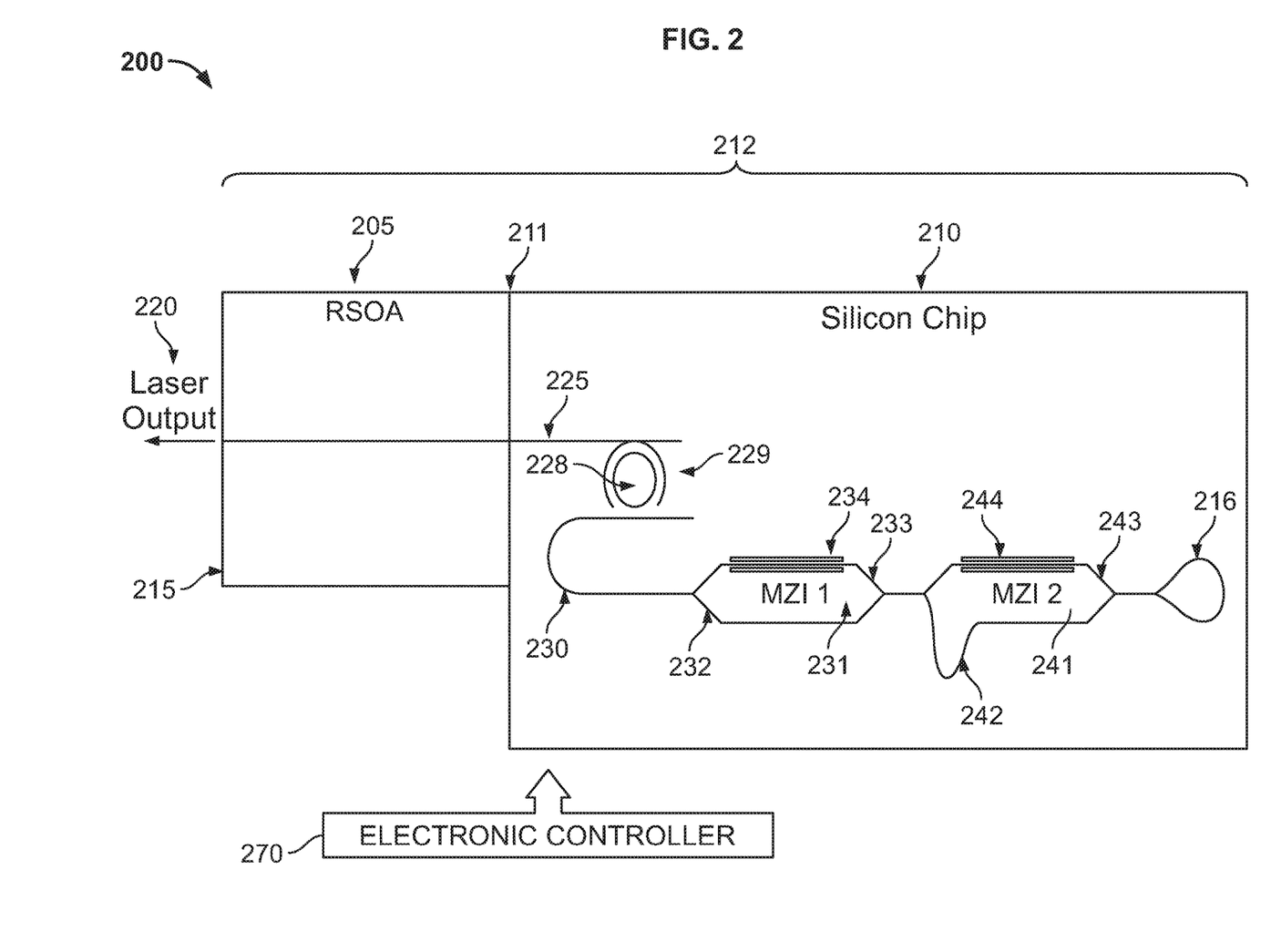
FIG. 2 shows a block diagram of a tunable laser according to one or more embodiments.

According to other embodiments, different combinations of fast tuning optical filter elements and slow tuning optical filter elements may be used. By way of example and not limitation, FIG. 2 shows a simplified block diagram of a tunable laser 200 according to another embodiment. For ease of illustration and description in comparison to the embodiment shown in FIG. 1, like elements are referenced with like reference numerals and will not be described in detail for sake of brevity (e.g., RSOA 105/205, waveguide 125/225, electronic controller 170/270, and so on).

The main difference between the embodiments in FIGS. 1 and 2 is that tunable laser 200 includes two MZI filters. As shown in FIG. 2, silicon chip 210 includes first MZI filter 231 arranged in series with a second MZI filter 241, with each of the MZI filters 231 and 241 having different FSRs. First MZI filter 231 is similar to MZI filter 131 from FIG. 1 and will not be described in further detail. Second MZI filter 241 includes two waveguides 242 and 243, with waveguide 242 serving as the reference arm in second MZI filter 241 and with p-i-n diode 244 being used to induce phase shift in the optical signal that is traversing waveguide 243. As shown, the length of waveguide 242 (reference arm 242) of second MZI filter 241 is longer than the length of waveguide 232 in first MZI filter 232 (reference arm 232). The difference in length between waveguides 242 and 243 or between waveguides 232 and 233 is referred to as dL. The dL in MZI filter 241 is longer than that of MZI filter 231. As will be described in further detail below, two fast-tunable filter elements (e.g., first MZI filter 231 and second MZI filter 241) with different FSRs (due to differences in path length) can be controlled or tuned in combination to select a lasing wavelength at single resonance of ring filter 228.

Figure 3A:
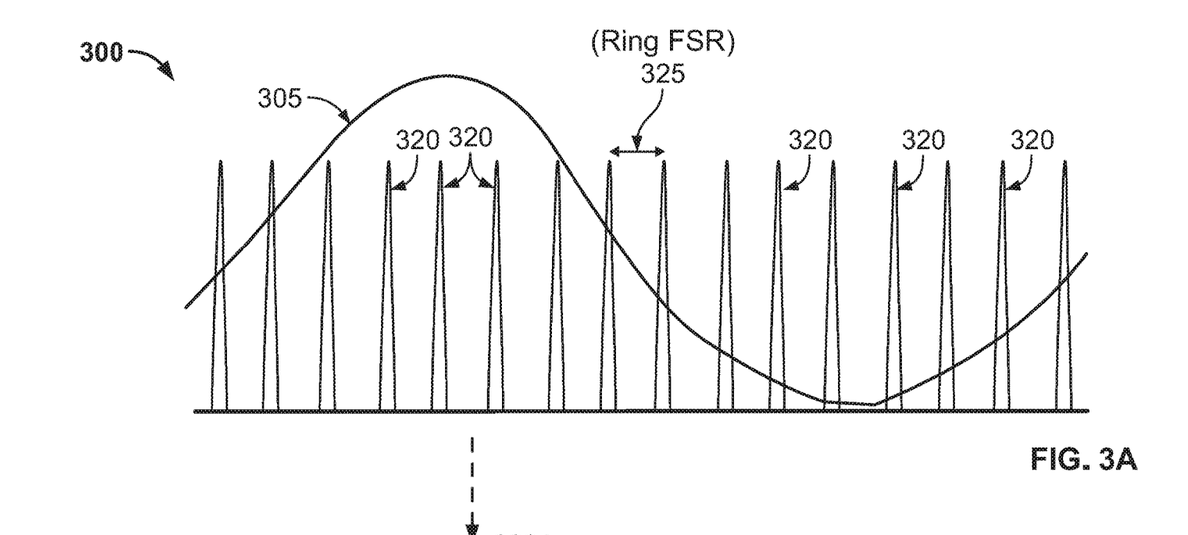
FIG. 3A shows a plot of a transmission spectra and FIG. 3B shows a more detailed view of features from the transmission spectra shown in FIG. 3A of a tunable laser according to one or more embodiments.
Figure 3B:
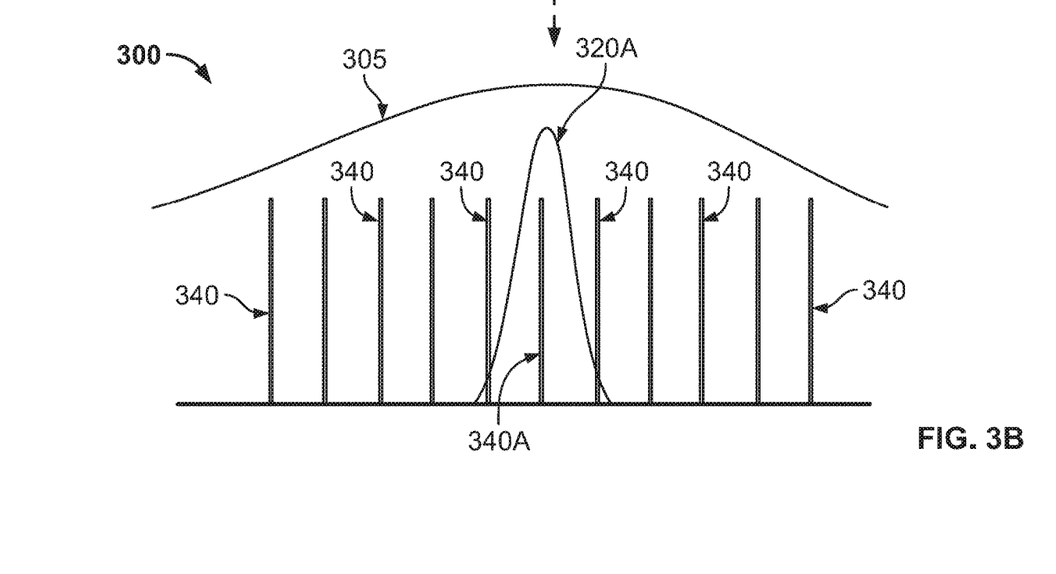

FIGS. 3A and 3B show a simplified representation of transmission spectra 300 for tunable filter elements according to the embodiment from FIG. 1. More specifically, transmission spectrum 305 corresponds to MZI filter 131 and transmission spectrum 320 corresponds to the ring resonances of ring filter 128. In this example, the transmission spectrum 305 of MZI filter 131 is configured to have a large FSR to cover a substantial part of the wide gain spectrum of RSOA 105 (e.g., approximately 100 nm). The FSR is directly determined by the dL of the MZI (e.g., MZI filter 131). The smaller FSR corresponding to ring filter 128 is represented by spacing 325 in FIG. 3A. In operation, MZI filter 131 is set to select one of the plurality of resonances 320 (of ring filter 128) for a lasing cavity mode, e.g., the single wavelength with the peaks in the spectra of both the MZI filter 131 and the ring filter 128. The simplified view shown in FIG. 3B illustrates an example tuning configuration in which ring resonance 320A is selected from among the set of ring resonances 320 so that wavelength 340A is the wavelength of the cavity mode selected for lasing from among the plurality of cavity modes 340 of the laser cavity 112 of FIG. 1.

Figure 4A:
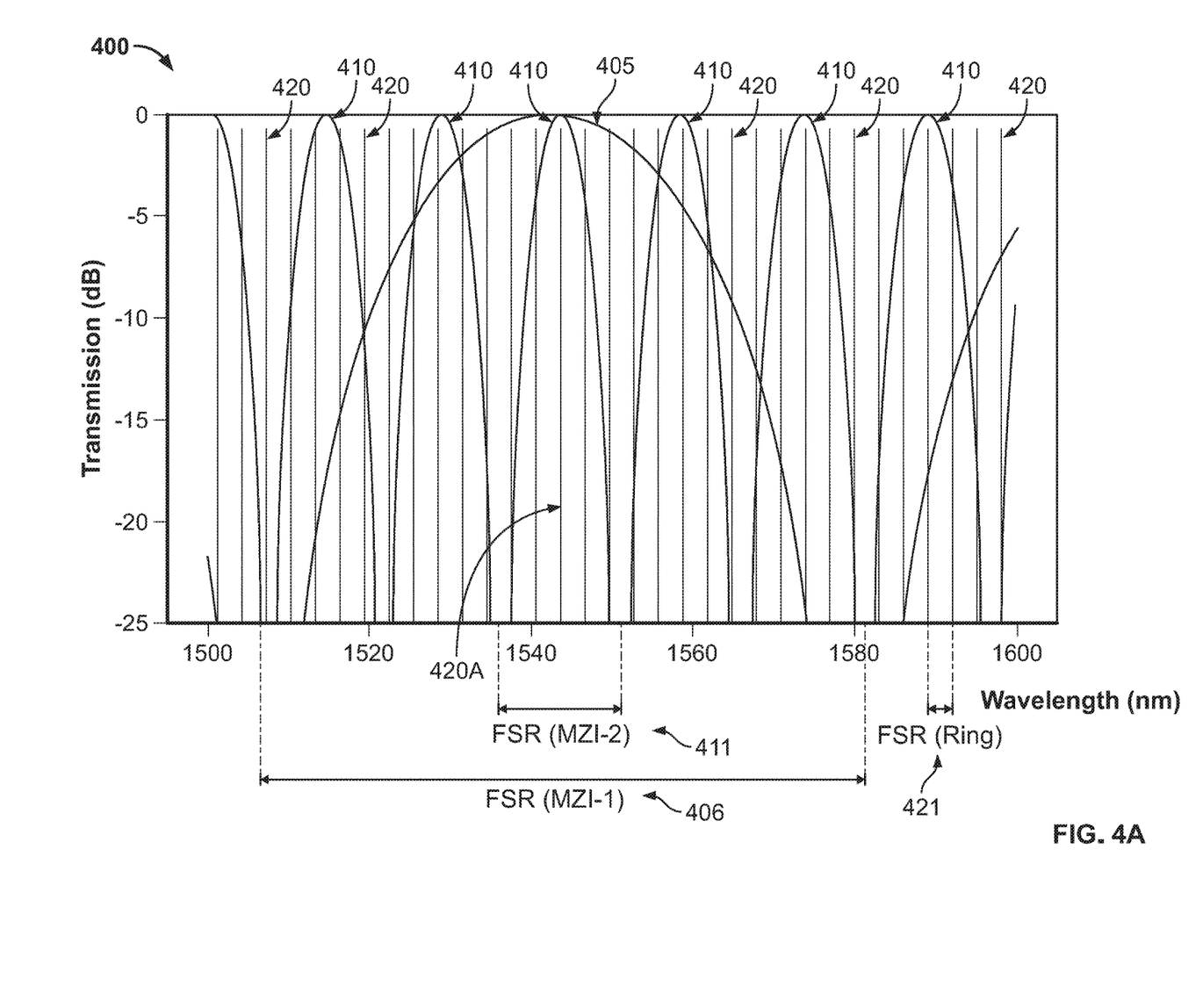
FIG. 4A shows a plot of a transmission spectra and FIG. 4B shows a more detailed view of features from the transmission spectra shown in FIG. 4A of a tunable laser according to one or more embodiments.
Figure 4B:
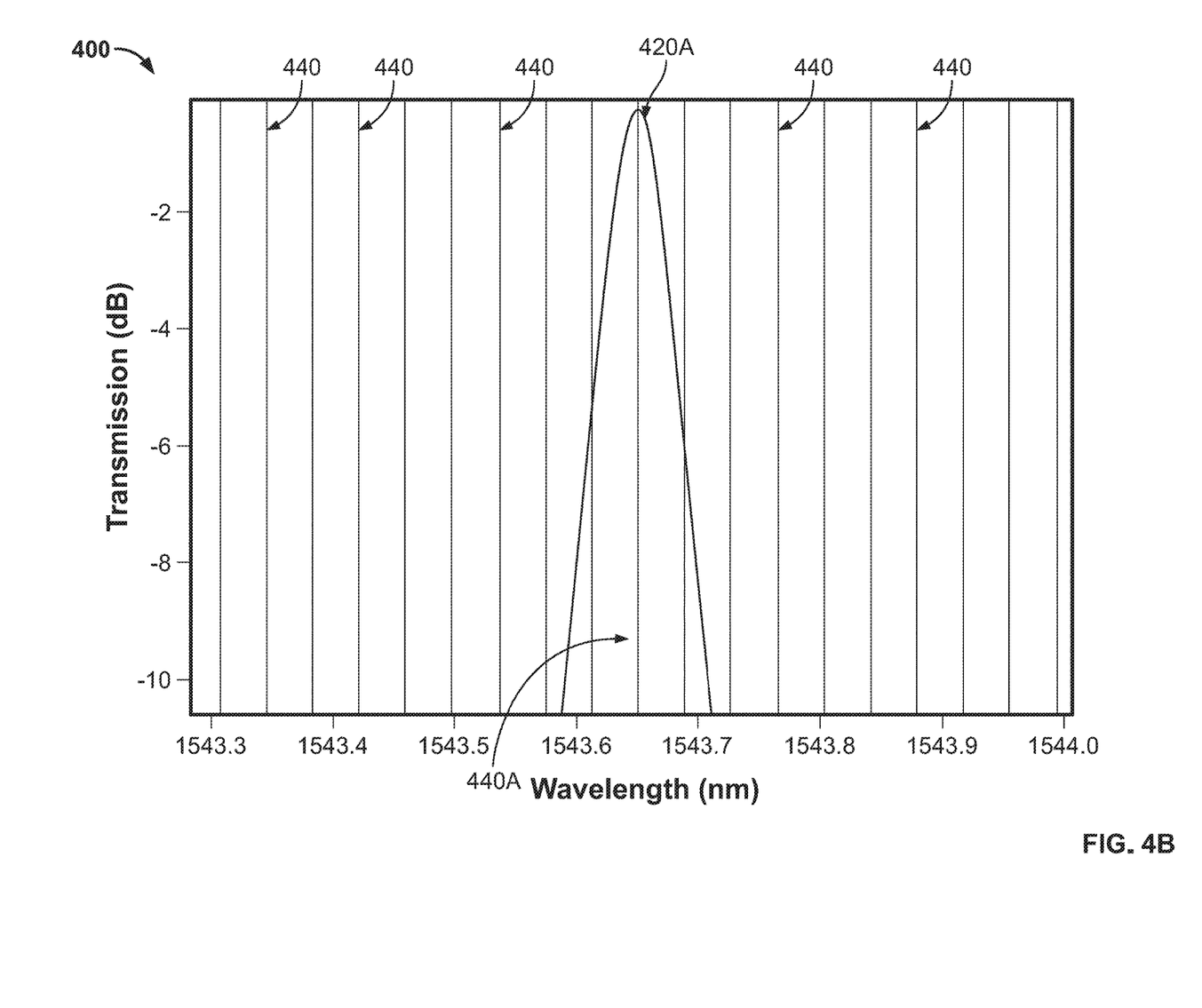

FIGS. 4A and 4B show a simplified representation of transmission spectra 400 for elements of tunable laser 200 according to the embodiment from FIG. 2, which utilizes two fast-tunable filter elements, i.e., MZI filters with p-i-n junctions therein. In FIG. 4A, transmission spectrum 405 corresponds to first MZI filter 231, transmission spectrum 410 corresponds to second MZI filter 241, and transmission spectrum 420 corresponds to the ring resonances of ring filter 228. In this example, the transmission spectrum 405 of first MZI filter 231 is configured to have a large FSR 406 to cover a substantial part of the wide gain spectrum of RSOA 205 (e.g., approximately 100 nm). Transmission spectrum 410 of second MZI filter 241 is configured with a smaller FSR 411 relative to first MZI filter 231. Transmission spectrum 420 of ring filter 228 is configured with FSR 421. Similar to the preceding example shown in FIGS. 3A and 3B, first and second MZI filters 231 and 241 are used for selecting one of the ring resonances 420 to support the lasing mode of laser cavity 212. In this example, the selected ring resonance is shown as ring resonance 420A, whose position determines the wavelength of the selected lasing cavity mode.

Given the narrow spacing (FSR) of resonances of the ring filter 228 relative to the spacings (FSRs) of peaks of the first and second MZI filters 231 and 241, FIG. 4B shows a close-up view to further illustrate selected ring resonance 420A and the closely spaced other cavity modes 440 of tunable laser 200. The longer the total optical path length of laser cavity 212, the more closely spaced are the cavity modes. In the example shown in FIG. 4B, ring filter 228 can be configured to effectively filter a single cavity mode to lase, designated as cavity mode 440A, given the lower attenuation of the mode 440A. As such, the single wavelength of the peak of lowest attenuation within the spectrum of wavelengths filtered by the combination of MZI filters 231 and 241 and ring filter 228 can be the lasing wavelength, i.e., the output wavelength of the tunable laser 200.

Figure 5:
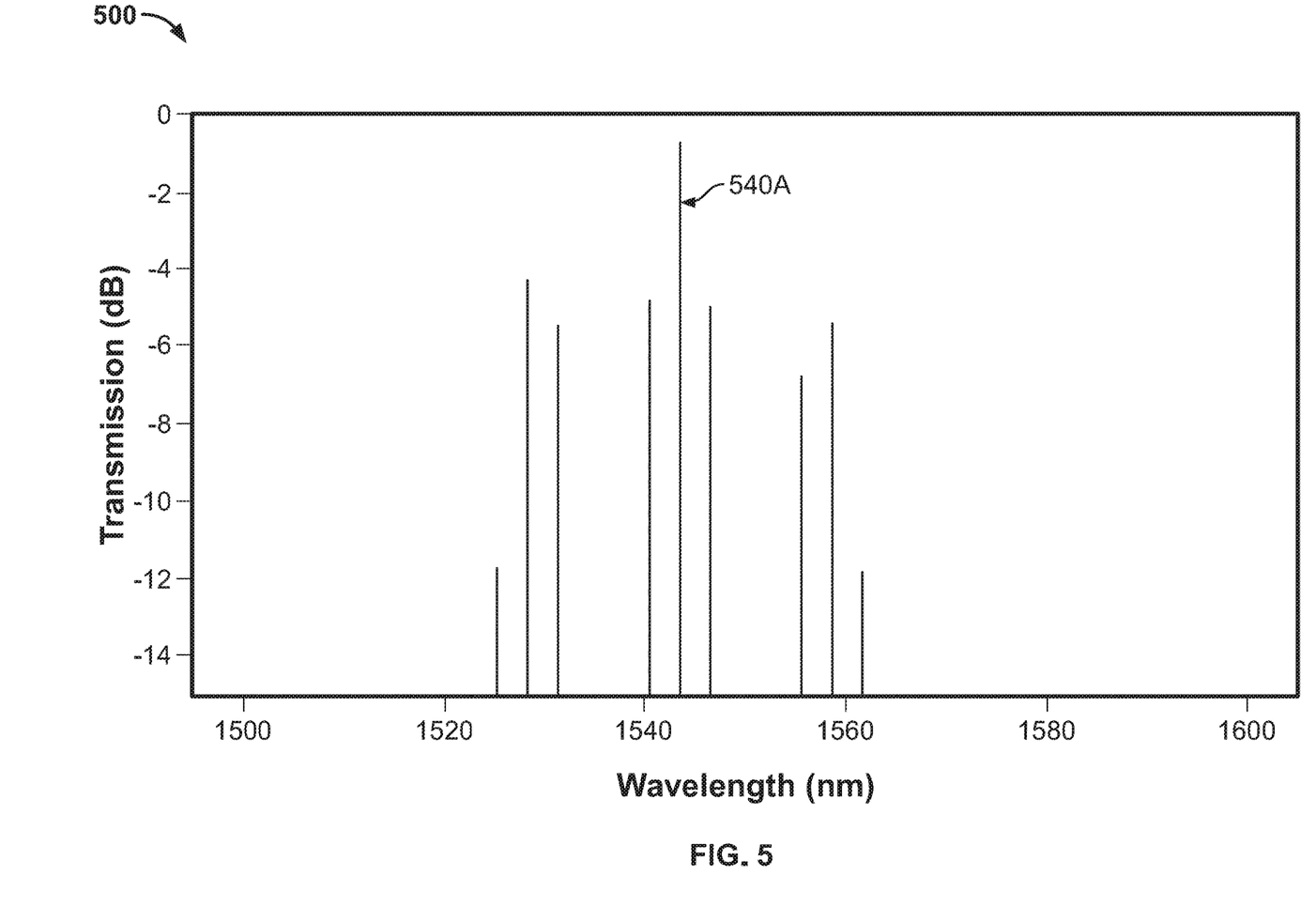
FIG. 5 shows a composite transmission spectra after filtering according to one or more embodiments.

FIG. 5 provides a view of the simplified composite transmission spectrum 500 with transmitted power according to the embodiments corresponding to FIGS. 2 and 4A/4B, e.g., due to the combined filtering of first MZI filter 231, second MZI filter 241 and ring filter 228. The dominant peak at a single wavelength is selected to lase, shown here as wavelength 540A. Because less attenuation exists for the selected cavity mode than for the other cavity modes, the selected mode should therefore lase with a high side-mode suppression ratio (SMSR), e.g., greater than approximately 30 dB. The lasing wavelength 540A may be further tuned by shifting the spectra of the ring filter 228 and the first and second MZI filters 231 and 241 to line up at a different wavelength.

According to various embodiments, the tunable laser is tunable across a broad range of wavelengths because the ring filter(s) and the MZI filter(s) are (i) both tunable across a full respective FSR individually, as described above, and (ii) may be aligned at any particular wavelength to select a new lasing mode. According to another aspect, a cavity phase shifter may also be utilized and adjusted during the tuning to modify (e.g., optimize) the alignment of the cavity modes to the resonances of the ring.

As described above, the ring filter is controlled by a heater and is the "slowest common denominator" in the tunable laser apparatus relative to the fast carrier-injection tuning of the MZI filters. However, overall fast tuning speed of the tunable laser can still be achieved with semi-alternating tuning of the two types of filters (e.g., the slow-tunable ring filter 228 and the fast-tunable MZI filters 231, 241 in tunable laser 200) according to another aspect of the various embodiments.

In one example, the one or more fast-tuning filters (e.g., MZI filter(s)) may be tuned in a first (fast) sweep to select the lasing mode to correspond to sequential ring resonances of the ring filter, one at a time. These lasing modes are separated by the FSR of the ring filter, and depending on the FSR and tuning range of the ring filter, there may be several (and up to many) lasing modes that can be swept in a relatively short amount of time depending on the tuning time of the p-i-n diodes (phase shifters) in the MZI filter(s), among other factors. After this fast tuning sweep, the heater of the ring filter can be readjusted to shift all resonances of the ring filter by a small step in wavelength, e.g., during a discrete interval after the fast tuning sweep of the MZI filter(s) (e.g., according to a step-like function). As will be described in further detail below, the shifting of resonances of the ring filter may also be performed during the fast sweep (e.g., in a continuous or nearly-continuous manner). Pre-emphasis techniques may also be utilized in controlling the heater in order to decrease delay and thereby increase the speed, e.g., initially applying a stronger driving voltage signal on the heater at the beginning of a step with the applied voltage then dropping and settling.

At this point and in this manner, each of the ring resonances corresponds to a new set of several (and up to many) lasing wavelengths. The fast-tuning filter(s) (e.g., MZI filter(s)) tune to select each wavelength, one at a time. By such alternating of fast and slow tuning, a large number of wavelengths can be swept in a given wavelength range and the effective tuning speed of the tunable laser may be as much as one to two orders of magnitude faster than a laser that is only thermally tuned. For example, an electronic controller (such as electronic controllers 170, 270 from FIGS. 1 and 2) can be configured to cause said tunings such that the faster tuning, optical filter(s) are wavelength-tuned 5 or more, 8 or more, 10 or more, 50 or more, and so on, times faster than the slower tuning, optical ring resonator (e.g., the slower tuning filter(s) are wavelength-tuned at a rate, at least, five times slower than the faster tuning optical filter (s)). In one example, the electronic controller can be configured to sweep the passband wavelength of the faster tuning, optical filters(s) at these rates (e.g., 5, 8, 10, 50, or more times) faster than the electronic controller can sweep the passband wavelength of the slower tuning, optical ring resonator.

By way of example and not limitation, the electronic controller may be configured to sweep the passband wavelengths of the filters by operating electrodes. For example, referring to FIG. 1, analog and/or digital circuitry (not shown) in electronic controller 170 may be used to send various control signals (e.g., electrical voltages and/or currents) to/through tunable elements of the laser cavity 112, e.g., to/through heater 129, p-i-n diode (phase shifter) 134, a cavity phase shifter (not shown), or other tunable controls (e.g., such as for controlling the RSOA current to adjust the optical gain), and so on. In some embodiments, these control signals may be sent through integrated metal wires on the integrated chip (e.g., silicon chip 110) or directly to contact pads of the tunable elements via flip-chip bonding. Electronic controller 170 (and 270 in FIG. 2) are therefore shown in simplified block diagram form with the arrow illustrating a coupling arrangement in simplified form. These examples are meant to be illustrative and not limiting in any manner.

Figure 6A:
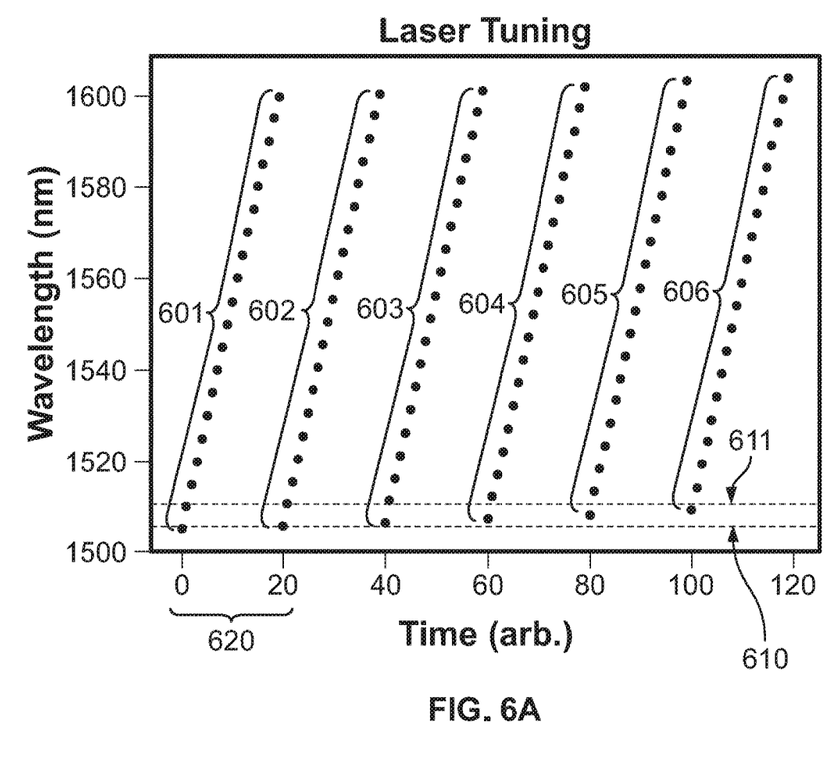
FIGS. 6A and 6B graphically illustrate tuning features of a tunable laser according to one or more embodiments.
Figure 6B:
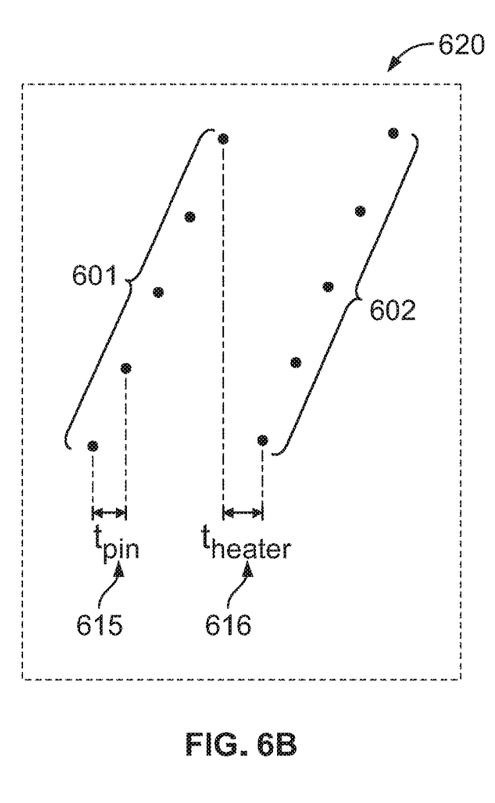

FIGS. 6A and 6B graphically illustrate alternating tuning of the different fast-tuning and slow-tuning filters in the tunable laser according to the embodiments. In particular, FIG. 6A shows a plot of wavelength versus time to show the order in which the wavelengths are swept across a particular tuning range. As shown in this example, which is not meant to be limiting but only illustrative, the tuning range covers approximately 100 nm in the 1.5 micron wavelength range. Starting at time 0, the tunable laser quickly scans (e.g., with fast-tuning MZI filter(s)), in a first wavelength-time sweep 601, a number of wavelengths in the tuning range. Each wavelength corresponds to a ring resonance of the ring filter and each wavelength is separated by the FSR (spacing) of the ring filter. In one embodiment, the heater is configured (via an electronic controller, as previously described) to tune the ring filter (e.g., shift the resonances of the ring filter), after which the fast tuning starts over, at a slightly shifted set of resonances, to perform the next wavelength-time sweep 602. This semi-alternating tuning process can continue to repeat (e.g., for wavelength-time sweeps 603-606, and so on) and thus is capable of covering a broad range. Horizontal lines 610 and 611 represent the FSR of the ring filter.

As described, the heater may be controlled in various different ways to effect tuning of the ring filter (resonator), including but not limited to, tuning by the heater in discrete intervals between fast-tuning steps (wavelength sweeps), tuning by the heater on a continuous basis during the fast-tuning steps, and so on. Referring to FIG. 6A and a simplified example of tuning the ring filter in discrete intervals, tuning across the wavelengths may occur as follows: [1500 nm, 1550 nm, 1600 nm]; [1501 nm, 1551 nm, 1601 nm]; [1502 nm, 1552 nm, 1602 nm]; and so on. Each wavelength subset in [ ], which may correspond to respective wavelength-time sweeps 601-606, is scanned by tuning the fast-tuning filters (e.g., MZI filters with p-i-n carrier injection) while the heater remains fixed. Between each wavelength subset, the heater is controlled to make a single change to tune the ring filter (resonator).

In the simplified example of tuning the ring filter in a continuous tuning mode, tuning across the wavelengths may occur as follows: [1500 nm, 1550.33 nm, 1600.66 nm]; [1501 nm, 1551.33, 1601.66]; [1502, 1552.33, 1602.66]; and so on. In this case, the heater is tuning the ring filter (resonator) the entire time. In each wavelength subset [ ], the fast-tuning filters tune across all of the FSRs of the slow-tuning ring filter (resonator). In this simplified example, only three (3) are shown, but more practically, the number would be higher. However, instead of a fixed separation matching the ring filter's FSR (e.g., 50 nm) as in the first example with discrete intervals, the continuous tuning mode maintains ring tuning as well. As such, the wavelength subsets have steps of FSR+[the amount the ring resonance has shifted between fast-tuning steps]. When a new wavelength subset is started, the first wavelength point has been shifted relative to the first wavelength point of the previous wavelength subset (e.g., 1501 nm vs 1500 nm). The end results of the continuous tuning mode and tuning in discrete intervals may be similar, however, continuous tuning of the ring filter may be easier to control in certain conditions.

There are several timing considerations that are associated with the semi-alternating tuning performed by the tunable laser and which are shown in FIG. 6B. In particular, FIG. 6B shows an enlarged view of adjacent wavelength-time sweeps 601 and 602 from FIG. 6A (from section 620). According to various embodiments, the time to change between wavelengths within a wavelength-time sweep may be in the nanosecond time scale range (e.g., approximately 1 to 10 ns). This time is shown as $t_{pin}$ 615, which represents the tuning time, for example, of a fast-tuning MZI filter that is being driven by the aforementioned p-i-n diode carrier-injection scheme. Another timing consideration is the settling time of the ring (resonator) filter, e.g., the "rise and fall" between successive wavelength-time sweeps. In the example shown in FIG. 6B, this time is shown as $t_{heater}$ 616, which represents the settling time between sets of fast tuning due to the heater time constant, e.g., the heater that provides the thermo-optic tuning control of the ring filter. According to various embodiments, the settling time may be in the microsecond time scale time range (e.g., approximately 1 μsec). This settling time between successive wavelength-time sweeps 601, 602 and so on may therefore introduce some additional time delay. However, as previously noted, various alternatives may be employed to mitigate any time delay attributable to the heater time constant, e.g., operation of the heater in a continuous mode instead of at discrete intervals in stepped fashion, use of pre-emphasis to shorten settling time, and so on. However, with the use of carrier-injection tuning for the fast-tuning filters and thermo-optic tuning of the slow-tuning filters, $t_{heater}$ will be greater than $t_{pin}$. These examples are meant to be illustrative and not limiting in any manner.

As shown in FIG. 6A, the plurality of wavelength-time sweeps 601-606 are performed in a temporal manner and in a "zigzag" pattern in time, e.g., scanning wavelengths (in the 1500 to 1600 nm range) in wavelength-time sweep 601 starting at time 0, dropping/settling to then perform the next set of wavelength scans (in the 1500 to 1600 range) in wavelength-time sweep 602 starting at approximately time 20, and so on. As described, the electronic controller (e.g., such as electronic controller 170, 270 from FIGS. 1 and 2) is configured to control the operation of the tunable laser to perform the zigzag sweep (e.g., control the tunable laser such that an output wavelength of the tunable laser performs a zigzag in time). In this manner, the zigzag wavelength sweeps 601-606, in time, generate accumulated data representative of a single wavelength sweep covering a given wavelength range. For example, this is in contrast to other tunable lasers which may sweep across a wavelength range in a continuous and/or linear order (e.g., without a zigzag) with, in some cases, the same list of wavelengths output by such lasers, but in a different order. In some embodiments, the zigzag in time includes a sequence of monotonic wavelength sweeps in time, each of the monotonic wavelength sweeps including a respective sequence of values of the output wavelength of the tunable laser, with the values of different ones of the monotonic wavelength sweeps being interleaved. In some examples of such embodiments, the electronic controller (e.g., such as electronic controller 170 or 270 from FIGS. 1 and 2) may be configured to generate a single monotonic wavelength sweep of the output wavelengths from the values of the plurality of monotonic wavelength sweeps, (e.g., from the accumulated data of the zigzag wavelength sweeps). The electronic controller (e.g., such as electronic controller 170 or 270 from FIGS. 1 and 2) or a separate controller (not shown, but in communication with electronic controller 170 or 270) may be configured to perform the interleaving functions.

According to another aspect of some embodiments, the wavelengths may be scanned in a substantially equally-spaced (in optical frequency or wavelength), but out-of-order manner, in terms of the scanning of the wavelengths that is performed in the successive, zigzag-patterned wavelength sweeps 601-606, in time. For example, each wavelength sweep (e.g., 601-606) may be configured to cover the same wavelengths (points), but can be performed out-of-order (e.g., a random-looking order within each wavelength sweep) with the different values from the wavelength sweeps then being interleaved. Referring to the previous examples and syntax for comparison, a series of wavelength sweeps was described as follows: [1500 nm, 1550 nm, 1600 nm]; [1501 nm, 1551 nm, 1601 nm]; [1502 nm, 1552 nm, 1602 nm]; and so on, where each subset [ ] corresponds to a wavelength sweep (e.g., 601). According to the present embodiment (i.e., out-of-order scanning), the wavelength sweeps may instead cover the same points with a different or random-seeming order, e.g., as follows: [1550 nm, 1500 nm, 1600 nm]; [1601 nm, 1551 nm, 1501 nm]; [1552 nm, 1502 nm, 1602 nm]; and so on. In this embodiment, it is the rapidly-tuned points within each subset [ ] that may be rearranged, rather than rearranging individual points between subsets. After sweeping the laser in such a random or random-seeming order, measurements made from the wavelength sweep may be rearranged/interleaved into a wavelength-sequential order. As noted in the above examples, the electronic controller (or a separate controller) may be configured to perform the interleaving functions.

The various embodiments described herein are intended to be illustrative and not limiting in any manner. Variations, substitutions and modifications are contemplated by the teachings herein. For example, another type of optical cavity, such as a Fabry-Perot cavity or photonic crystal cavity, may be used instead of an optical ring resonator. The Mach-Zehnder interferometers may be replaced with Michelson interferometers as another of several examples. The RSOA gain section may be replaced with another type of gain section that is compatible with integrated photonics, e.g., rare-earth doped material that can be optically pumped. The optical ring resonator (filter) could also be implemented in a second layer or using a different material, e.g., silicon nitride or silicon oxynitride. The laser cavity could also be implemented in lithium niobate and use Pockels tuning instead of carrier-injection for the fast-tuning filter elements. Additionally, the specific number and type of components may be driven by certain performance and/or design considerations. For example, the optical gain of the material may be a consideration in terms of how many fast-tuning elements may be desired, e.g., the number of Mach-Zehnder interferometers (MZIs) to cover the gain spectrum, and so on. As described, an electronic controller, e.g., electronic controller 170 (FIG. 1), electronic controller 270 (FIG. 2), is used for controlling the tunable laser. Such a controller may be a microcontroller and control may be effected with the use of lookup tables (e.g., voltages to apply for tuning the MZIs and the ring filters, etc.). These other examples are also intended to be illustrative and not limiting in any manner.

As described, tunable lasers have many different uses in various applications and systems. For example, a tunable laser with fast scanning capability according to the various embodiments described herein may be used for rapidly and densely scanning wavelengths (e.g., in a parallel processing-like manner) in a light detection and ranging (LIDAR) device. Such LIDAR devices may have applicability in self-driving car applications, which need information quickly from many directions. For example, a different wavelength can be sent in each direction and a directional map can then be obtained by correlating return information according to wavelength from the reflected optical signals. Such systems may need to measure a reflected optical signal across many wavelengths from a target or object. According to the described embodiments, the tunable laser can output a signal to a separate control unit (e.g., in the LIDAR system) to identify the current wavelength, the wavelength set, the order of wavelengths being scanned, and so on. In one example, a LIDAR device may include an optical transmitter and an optical receiver, with the optical transmitter including the wavelength-tunable laser and the electronic controller according to examples described above. Accordingly, the tunable laser according to the various embodiments offers a robust, cost-effective solution without complex production requirements. The optical receiver detects light reflected from a target or the environment after being emitted from the transmitter. Other examples in which the disclosed embodiments may be advantageously employed include applications in spectroscopy, optical coherence tomography (OCT), optical device characterization, and many others. For example, an OCT imaging apparatus may include the wavelength-tunable laser and the electronic controller according to examples described above. These examples are intended to be illustrative only and not limiting in any manner.

The foregoing merely illustrates the principles of the disclosure. It will thus be appreciated that those skilled in the art will be able to devise various arrangements that, although not explicitly described or shown herein, embody the principles of the disclosure and are included within its spirit and scope. Furthermore, all examples and conditional language recited herein are principally intended to be only for pedagogical purposes to aid the reader in understanding the principles of the disclosure and the concepts contributed by the inventor to furthering the art, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents as well as equivalents developed in the future.

What is claimed is:

1. An apparatus comprising:
   a wavelength-tunable laser; and
   an electronic controller configured to control the wavelength-tunable laser such that an output wavelength of the wavelength-tunable laser performs a zigzag in time, wherein the wavelength-tunable laser comprises:
   a first tunable filter apparatus; and
   a second tunable filter apparatus; and
   wherein the electronic controller is configured to wavelength-tune the second tunable filter apparatus at a rate, at least, five times slower than the electronic controller is configured to wavelength-tune the first tunable filter apparatus.

2. The apparatus of claim 1, wherein the wavelength-tunable laser is an integrated device comprising:
   an optical amplifier; and
   a waveguide laser cavity including the optical amplifier, the waveguide laser cavity including the first tunable filter apparatus and the second tunable filter apparatus in a sequential arrangement.

3. The apparatus of claim 2, wherein the optical amplifier is a reflective semiconductor optical amplifier and wherein the waveguide laser cavity is a silicon waveguide laser cavity.

4. The apparatus of claim 3, wherein the first tunable filter apparatus includes one or more tunable Mach-Zehnder interferometers and the second tunable filter apparatus includes one or more tunable optical ring resonators.

5. The apparatus of claim 4, wherein the one or more tunable Mach-Zehnder interferometers are semiconductor junction devices.

6. The apparatus of claim 4, further comprising a heater element configured to control tuning via thermo-optic effect of the one or more tunable optical ring resonators.

7. The apparatus of claim 4, wherein the one or more tunable Mach-Zehnder interferometers and the one or more tunable optical ring resonators are configured to perform, in combination, filtering to select a lasing mode for the wavelength-tunable laser.

8. The apparatus of claim 1, wherein the electronic controller is further configured to generate a single monotonic wavelength sweep of the output wavelengths from the values of the monotonic wavelength sweeps.

9. An apparatus comprising:
   a wavelength-tunable laser; and
   an electronic controller configured to control the wavelength-tunable laser such that an output wavelength of the wavelength-tunable laser performs a zigzag in time, wherein:
   the zigzag in time includes a sequence of monotonic wavelength sweeps in time, each of the monotonic wavelength sweeps comprising a respective sequence of values of the output wavelength of the wavelength-tunable laser, the values of different ones of the monotonic wavelength sweeps being interleaved.

10. The apparatus of claim 9, wherein the electronic controller is further configured to generate a single monotonic wavelength sweep of the output wavelengths from the values of the monotonic wavelength sweeps.

11. The apparatus of claim 9, wherein the wavelength-tunable laser comprises:
    a first tunable filter apparatus; and
    a second tunable filter apparatus; and
    wherein the electronic controller is configured to wavelength-tune the second tunable filter apparatus at a rate, at least, five times slower than the electronic controller is configured to wavelength-tune the first tunable filter apparatus.

12. The apparatus of claim 9, further comprising a directional LIDAR device comprising an optical transmitter and an optical receiver, the optical transmitter including the wavelength-tunable laser and the electronic controller.

13. The apparatus of claim 9, further comprising an optical coherence tomography imaging apparatus comprising the wavelength-tunable laser and the electronic controller.

14. An apparatus comprising:
    a wavelength-tunable laser; and
    an electronic controller configured to control the wavelength-tunable laser such that an output wavelength of the wavelength-tunable laser performs a zigzag in time, wherein:
    the zigzag in time includes a sequence of wavelength sweeps in time in which wavelengths are scanned out of order in each of the wavelength sweeps, each of the wavelength sweeps comprising a respective set of values of the output wavelength of the wavelength-tunable laser, the values of different ones of the wavelength sweeps being interleaved.

15. The apparatus of claim 14, wherein the wavelength-tunable laser comprises:
a first tunable filter apparatus; and
a second tunable filter apparatus; and
wherein the electronic controller is configured to wavelength-tune the second tunable filter apparatus at a rate, at least, five times slower than the electronic controller is configured to wavelength-tune the first tunable filter apparatus.

16. The apparatus of claim 14, wherein the electronic controller is further configured to generate a single monotonic wavelength sweep of the output wavelengths from the values of the monotonic wavelength sweeps.

17. The apparatus of claim 14, further comprising a directional LIDAR device comprising an optical transmitter and an optical receiver, the optical transmitter including the wavelength-tunable laser and the electronic controller.

18. The apparatus of claim 14, further comprising an optical coherence tomography imaging apparatus comprising the wavelength-tunable laser and the electronic controller.

19. An apparatus comprising:
a wavelength-tunable laser; and
an electronic controller configured to control the wavelength-tunable laser such that an output wavelength of the wavelength-tunable laser performs a zigzag in time, further comprising a directional LIDAR device comprising an optical transmitter and an optical receiver, the optical transmitter including the wavelength-tunable laser and the electronic controller.

20. The apparatus of claim 19, wherein the wavelength-tunable laser comprises:
a first tunable filter apparatus; and
a second tunable filter apparatus; and
wherein the electronic controller is configured to wavelength-tune the second tunable filter apparatus at a rate, at least, five times slower than the electronic controller is configured to wavelength-tune the first tunable filter apparatus.

21. The apparatus of claim 19, wherein the electronic controller is further configured to generate a single monotonic wavelength sweep of the output wavelengths from the values of the monotonic wavelength sweeps.

22. An apparatus comprising:
a wavelength-tunable laser; and
an electronic controller configured to control the wavelength-tunable laser such that an output wavelength of the wavelength-tunable laser performs a zigzag in time, further comprising an optical coherence tomography imaging apparatus comprising the wavelength-tunable laser and the electronic controller.

23. The apparatus of claim 22, wherein the wavelength-tunable laser comprises:
a first tunable filter apparatus; and
a second tunable filter apparatus; and
wherein the electronic controller is configured to wavelength-tune the second tunable filter apparatus at a rate, at least, five times slower than the electronic controller is configured to wavelength-tune the first tunable filter apparatus.

24. The apparatus of claim 22, wherein the electronic controller is further configured to generate a single monotonic wavelength sweep of the output wavelengths from the values of the monotonic wavelength sweeps.

* * * * *